(12) United States Patent
Kwak et al.

(10) Patent No.: US 7,453,203 B2
(45) Date of Patent: Nov. 18, 2008

(54) ORGANIC ELECTRO LUMINESCENCE DISPLAY INCLUDING AN INSULATING LAYER HAVING CONTACT HOLES IN A REGION WHERE A POWER LINE OVERLAPS AN ELECTRODE

(75) Inventors: Won-Kyu Kwak, Seongnam-si (KR); Kyong-Do Kim, Seoul (KR)

(73) Assignee: Samsung SDI Co., Ltd., Suwon (KR)

( * ) Notice: Subject to any disclaimer, the term of this patent is extended or adjusted under 35 U.S.C. 154(b) by 448 days.

(21) Appl. No.: 11/028,068

(22) Filed: Jan. 4, 2005

(65) Prior Publication Data
US 2005/0146264 A1  Jul. 7, 2005

(30) Foreign Application Priority Data
Jan. 5, 2004  (KR) .................... 10-2004-0000434

(51) Int. Cl.
   *H01J 1/62* (2006.01)
   *H01J 63/04* (2006.01)
(52) U.S. Cl. .................... 313/506; 313/498; 313/500
(58) Field of Classification Search ......... 313/498–512; 315/169.1, 169.3; 257/72
   See application file for complete search history.

(56) References Cited
U.S. PATENT DOCUMENTS
2002/0140646 A1  10/2002  Sato et al.
2003/0146693 A1 *  8/2003  Ishihara et al. .............. 313/504

FOREIGN PATENT DOCUMENTS

| JP | 2001-102169 | 4/2001 |
|---|---|---|
| JP | 2002-040961 | 2/2002 |
| JP | 2002-287663 | 10/2002 |
| JP | 2003-058080 | 2/2003 |
| KR | 10-1999-0046876 | 7/1999 |
| KR | 10-2002-0082138 | 10/2002 |

* cited by examiner

*Primary Examiner*—Toan Ton
*Assistant Examiner*—Bumsuk Won
(74) *Attorney, Agent, or Firm*—H.C. Park & Associates, PLC (57) ABSTRACT

An organic electro luminescence display comprises a pixel portion on which a plurality of pixels are arranged with a first electrode, a second electrode, and an organic thin film layer interposed between the first and second electrodes, a first power line supplying a first level voltage to the pixels of the pixel portion; and a second power line having at least a region overlapped with the second electrode to supply a second level voltage to the second electrode, and an insulating layer having a plurality of contact holes in the overlapped region between the second power line and the second electrode. The sum of the circumferences of each contact hole is greater than the circumference of the overlapped region.

33 Claims, 6 Drawing Sheets

ORGANIC ELECTRO LUMINESCENCE DISPLAY INCLUDING AN INSULATING LAYER HAVING CONTACT HOLES IN A REGION WHERE A POWER LINE OVERLAPS AN ELECTRODE

This application claims the benefit of Korean Patent Application No. 2004-00434, filed on Jan. 5, 2004, which is hereby incorporated by reference for all purposes as if fully set forth herein.

BACKGROUND OF THE INVENTION

1. Field of the Invention

The present invention relates to an organic electro luminescence display and, more particularly, to an organic electro luminescence display in which a cathode power line is connected with a cathode electrode by a plurality of contact holes.

2. Description of the Related Art

Typically, organic electro luminescence displays are self-emissive displays that are classified, according to the direction of light emitted from their organic emission layer, as either bottom-emitting types, top-emitting types, or dual-emitting types. The top-emitting type emits light in a direction away from the substrate on which the pixels are arranged, while the bottom-emitting type emits light toward the substrate on which the pixels are arranged. Top-emitting types have a higher aperture ratio than bottom-emitting types.

In the top-emitting type, because the light is emitted from the organic emission layer away from the substrate on which the pixels are arranged, one of the electrodes between which the organic emission layer is interposed should be transparent so that light may be transmitted through it. Typically, the transparent electrode is made of transparent conductive material such as Indium Tin Oxide (ITO). Transparent conductive material has a high resistance value, however, which causes a voltage (IR) drop, thereby creating an inconsistent brightness on the display.

To solve this problem, a technology has been proposed that uses a metallic material as a cathode power line for supplying a cathode voltage to a transparent cathode electrode, which is one of the two electrodes formed on the upper and lower portions of the organic emission layer.

Figure 1:
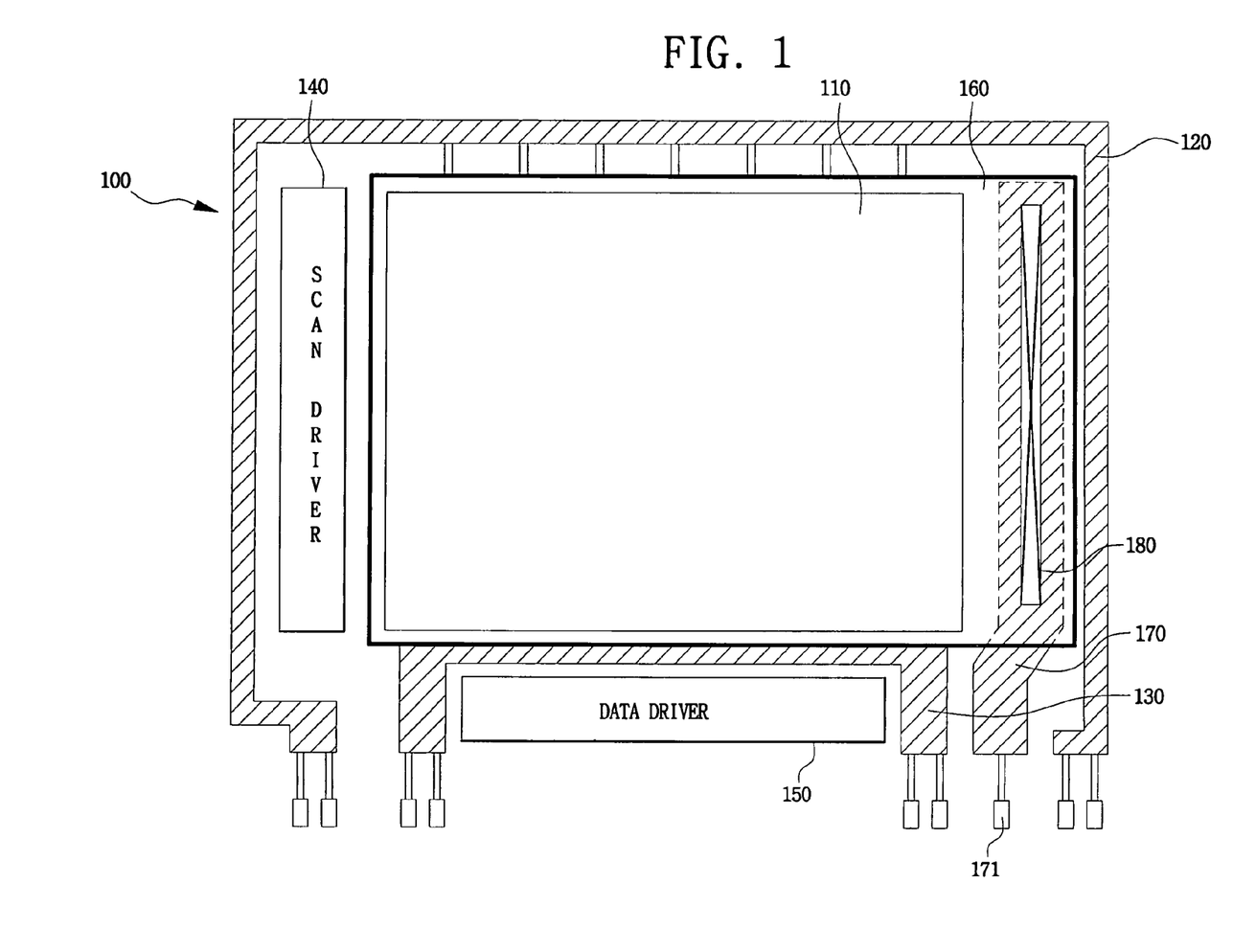
FIG. 1 shows a plan view of a conventional organic electro luminescence display.

FIG. 1 shows a plan view of a conventional organic electro luminescence display with a cathode power line.

Referring to FIG. 1, a conventional organic electro luminescence display 100 comprises a pixel portion 110 on which a plurality of pixels are arranged, an upper power line 120 on the top, right and left sides of the pixel portion 110 to supply the power supply voltage VDD, a lower power line 130 on the bottom side of the pixel portion 110 to supply the power supply voltage VDD, a scan driver 140 that supplies a scan signal sequentially to pixels of the pixel portion 110, a data driver 150 that supplies a data signal to pixels of the pixel portion 110, and a cathode electrode 160, which is formed to cover all of the pixel portion 110.

Figure 2:
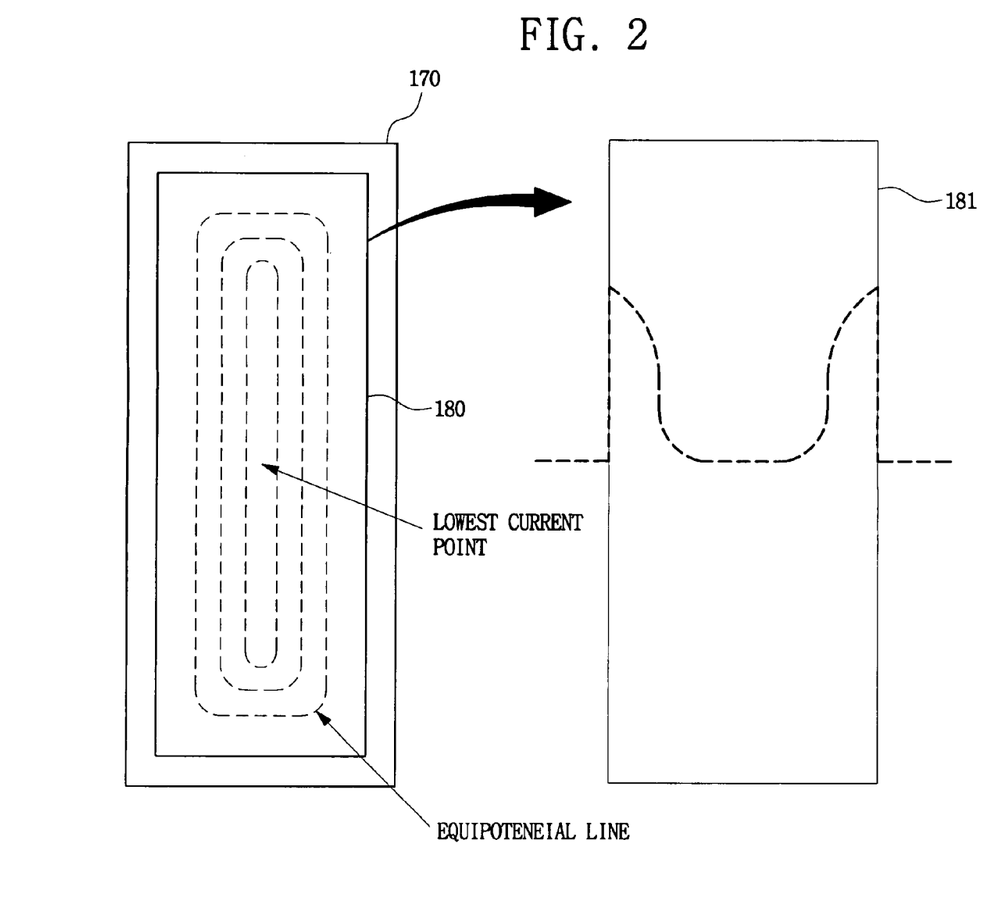
FIG. 2 shows a plan view of the cathode power line connected with the cathode electrode by a contact hole in the conventional organic electro luminescence display of FIG. 1.

The conventional organic electro luminescence display 100 further comprises an external terminal 171, which is used to apply an external voltage to the cathode power line 170. As shown in FIGS. 1 and 2, the cathode power line 170 is connected with the cathode electrode 160 by contact hole 180, thereby connecting the cathode electrode 160 to the external voltage supplied at the external terminal 171.

With this configuration, the conventional organic electro luminescence operates as follows.

The scan driver 140 signal and the data driver 150 signal are transmitted to the pixels in the pixel portion 110. A pre-determined level of power supply voltage VDD is supplied from the upper and lower power lines 120, 130 to the pixels in the pixel portion 110, and the cathode voltage is supplied from the cathode power line 170 to the cathode electrode 160 via the contact hole 180. Switching and driving transistors (not shown) provided in each of the pixels arranged in the pixel portion 110 then operate, so that light is emitted from the organic emission layer and transmitted through the cathode electrode 160.

During this operation, the electric current flowing through the cathode power line 170 is concentrated on the edge of the contact hole 180, so that current density is highest at the edge of the contact hole 180. Equipotential lines within the contact hole 180, as shown in FIG. 2, show that the current mobility decreases from the edge to the center of the contact hole 180, and the current is lowest at the center of the contact hole 180.

Hence, the larger the contact hole 180 is, the more its circumference is lengthened, thereby concentrating the current density on its edge. This results in a decrease of current mobility from the edge to the center of the contact hole 180, which in turn results in a voltage (IR) drop and decreases brightness in the display.

SUMMARY OF THE INVENTION

Accordingly, the present invention is directed to an organic electro luminescence display that substantially obviates one or more of the problems due to limitations and disadvantages of the related art.

The present invention provides an organic electro luminescence display in which current mobility is increased by connecting a cathode power line to a cathode electrode via a plurality of contact holes.

The present invention also provides an organic electro luminescence display that can prevent a voltage (IR) drop in a cathode power by utilizing auxiliary cathode power lines to supply the external terminal voltage to the cathode power line. The present invention provides an organic electro luminescence display comprising a pixel portion on which a plurality of pixels are arranged with a first electrode, a second electrode, and an organic thin film layer interposed between the first and second electrodes; a first power line supplying a first level voltage to the pixels of the pixel portion; a second power line having at least a region overlapped with the second electrode to supply a second level voltage to the second electrode; an insulating layer having a plurality of contact holes in the overlapped region between the second power line and the second electrode; and the sum of circumferences of each contact hole is greater than the circumference of the overlapped region.

The organic electro luminescence display may comprise an insulating layer having a plurality of contact holes in the overlapped region between the second power line and the second electrode, wherein the second power line is arranged in at least one side of the pixel portion, and wherein the second power line includes a plurality of auxiliary power lines for supplying the voltage to the second electrode.

The organic electro luminescence display may well comprise an insulating layer having a plurality of contact holes in the overlapped region between the second power line and the second electrode, wherein the plurality of contact holes, arranged in rows and columns, allow the second electrode to be connected with the second power line, and wherein the insulating layer includes at least two contact holes in the column direction.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Reference will now be made in detail to embodiments of the present invention, examples of which are illustrated in the accompanying drawings.

Figure 3:
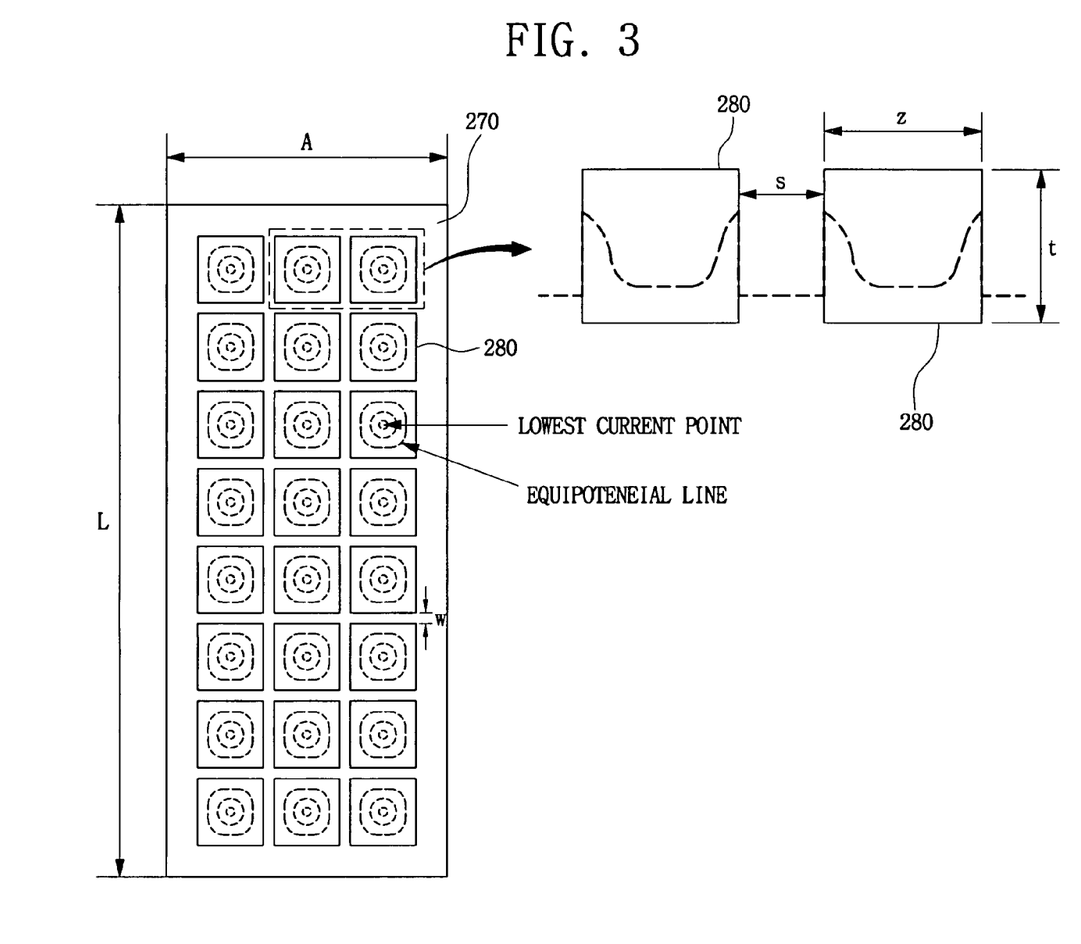
FIG. 3 shows a plan view of a cathode power line connected with a cathode electrode by a plurality of contact holes in an organic electro luminescence display according to a first exemplary embodiment of the present invention.

FIG. 3 shows a plan view of a cathode power line connected with a cathode electrode by a plurality of contact holes in an organic electro luminescence display according to a first exemplary embodiment of the present invention. Since the first exemplary embodiment of the present invention is the same as the organic electro luminescence display illustrated in FIG. 1 except for the structure of the cathode power line and the contact holes, only the cathode power line and the contact holes are illustrated in FIG. 3.

An organic electro luminescence display according to the first exemplary embodiment of the present invention comprises a pixel portion on which a plurality of pixels are arranged; an upper power line on the top, right and left sides of the pixel portion to supply the power supply voltage VDD; a lower power line on the bottom side of the pixel portion to supply the power supply voltage VDD; a scan driver that supplies a scan signal sequentially to the pixels of the pixel portion; a data driver that supplies a data signal to the pixels of the pixel portion; a cathode electrode that is formed to cover all of the pixel portion; and a cathode power line that is overlapped with the cathode electrode and supplies a cathode voltage from an external terminal to the cathode electrode.

Referring to FIG. 3, the cathode power line 270 is electrically connected with the cathode electrode by a plurality of contact holes 280, which are formed in an interposed insulating layer (not shown).

The contact holes 280 are arranged in a matrix comprised of rows and columns in the region where the cathode power line 270 is overlapped with the cathode electrode, so that each row and each column has the same number of contact holes. Further, all contact holes 280 are congruent, and they are arranged to have the same distance between each other in the row and column direction, although the distance between adjacent holes in the row direction need not be the same as the distance between adjacent holes in the column direction. According to the first exemplary embodiment of the present invention as shown in FIG. 3, the contact hole 280 has a square shape, but the contact hole 280 may have any other shape including rectangular, circular, elliptical, and polygonal.

As compared with the circumference of a single contact hole like the conventional contact hole 180 of FIG. 1, the total circumference of the plurality of contact holes 280 according to the first exemplary embodiment as shown in FIG. 3 is as determined below.

Let the lengths of each contact hole 280 be "z" and "t", in the row and column directions, respectively, and the distance between the adjacent contact holes 280 be "s" and "w", in the row and column directions, respectively. Therefore, the area of each contact hole 280 is "z×t", and the circumference of each contact hole 280 is "2(z+t)". If "n" is the total number of contact holes 280 in the region where the cathode power line 270 is overlapped with the cathode electrode, then the total area of all contact holes 280 is "n(z×t)" and the total circumference of all contact holes 280 is "2n(z+t)".

On the other hand, if a single, maximized contact hole is formed in the region where the cathode power line is overlapped the cathode electrode, the lengths of the maximized contact hole would be "A" and "L" in the row and column directions, respectively. Therefore, the area of the maximized contact hole is "A×L", and its circumference is "2(A+L)".

Hence, in the case of this exemplary embodiment, the voltage (IR) drop can be prevented by arranging the plurality of contact holes to satisfy the following two conditions:

$$L \times A > n(z \times t) \quad (1)$$

$$2n(z \times t) > 2(A+L) \quad (2)$$

In this exemplary embodiment, the distances "s" and "w" between each adjacent contact hole 280 should be less than or equal to either of the lengths "z" or "t" of each contact hole 280. Alternatively, the distances "s" and "w" between each adjacent contact hole 280 should be less than or equal to the least of "z" and "t".

When conditions (1) and (2) noted above are met, the total circumference of the plurality of contact holes is greater than the circumference of the region where the cathode power line is overlapped with the cathode electrode, thereby increasing the current mobility and preventing the voltage (IR) drop.

In other words, as shown in FIG. 3, along the equipotential lines, the current density is higher near the edge of each contact hole 280 and is lower near the center of each contact hole 280. Therefore, the center of each contact hole 280 is the point at which the current density is lowest. However, as shown in this first exemplary embodiment, when the plurality of contact holes are formed to have a total circumference greater than the circumference of the region where the cathode power line is overlapped with the cathode electrode, there are formed a plurality of regions having the high current density of an equivalent level along the equipotential lines in the edge of the each contact hole 280. This increases current mobility.

Thus, according to the first exemplary embodiment of the present invention, a plurality of contact holes 280 formed within an organic electro luminescence display can reduce the voltage (IR) drop by increasing the current mobility, thereby preventing a decrease in the brightness of the display.

Figure 4:
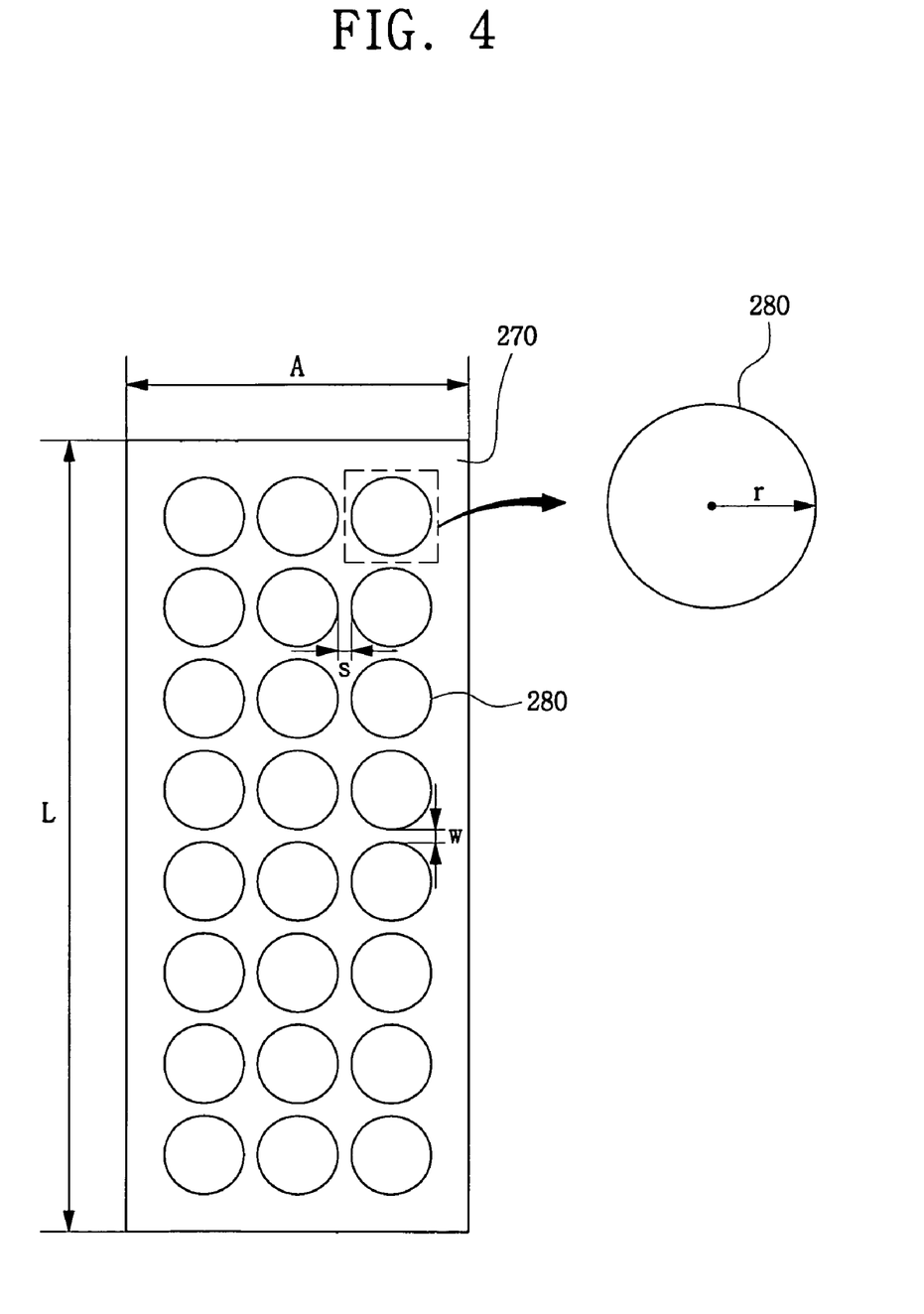
FIG. 4 shows a plan view of a cathode power line connected with a cathode electrode by a plurality of contact holes in an organic electro luminescence display according to a second exemplary embodiment of the present invention.

FIG. 4 shows a plan view of a cathode power line connected with a cathode electrode by a plurality of contact holes in an organic electro luminescence display according to a second exemplary embodiment of the present invention. Since the second exemplary embodiment of the present invention is the same as the organic electro luminescence display illustrated in FIG. 1 except for the structure of the cathode power line and the contact holes, only the cathode power line and the contact holes are illustrated in FIG. 4.

Referring to FIG. 4, the cathode power line 270 is electrically coupled to the cathode electrode by a plurality of contact holes 280, which are formed in an interposed insulating layer (not shown).

The contact holes 280 are arranged in a matrix comprised of rows and columns in the region where the cathode power line 270 is overlapped with the cathode electrode, so that each row and each column has the same number of contact holes. Further, all contact holes 280 are congruent, and they are arranged to have the same distance between each other in the row and column direction, although the distance between adjacent holes in the row and column direction need not be the same as the distance between adjacent holes in the column direction. According to the second exemplary embodiment of the present invention as shown in FIG. 4, the contact hole 280 has a circular shape, but the contact hole 280 may have any other shape including rectangular, square, elliptical, and polygonal.

As compared with the circumference of a single contact hole like the conventional contact hole 180 of FIG. 1, the total circumference of the plurality of contact holes 280 according to the second exemplary embodiment as shown in FIG. 4 is as follows.

Let the radius of each contact hole 280 be "r", and the distances between the adjacent contact holes 280 be "s" and "w" in the row and column directions, respectively. Therefore, the area of each contact hole 280 is "$\pi r^2$", and the circumference of each contact hole 280 is "$2\pi r$". If "n" is the total number of contact holes 280 in the region where the cathode power line 270 is overlapped with the cathode electrode, then the total area of all contact holes 280 is "$n\pi r^2$" and the total circumference of all contact holes 280 is "$2n\pi r$".

On the other hand, if a single, maximized contact hole is formed in the region where the cathode power line is overlapped with the cathode electrode, the lengths of the maximized contact hole in the row and column directions are "A" and "L". Therefore, the area of the maximized contact hole is "A×L", and its circumference is "2(A+L)".

Hence, in the case of this exemplary embodiment, the voltage (IR) drop can be prevented by arranging the plurality of contact holes to satisfy the following conditions (3) and (4).

$$L \times A > n\pi r^2 \quad (3)$$

$$2n\pi r > 2(A+L) \quad (4)$$

In this exemplary embodiment, the distances "s" and "w" between each adjacent contact hole 280 should be less than or equal to the diameter (2r) of each contact hole 280.

When conditions (3) and (4) noted above are met, the total area of the plurality of contact holes is less than the area of the single contact hole of the conventional organic electro luminescence display, but the total circumference of the plurality of contact holes is greater than the circumference of the conventional single contact hole.

Thus, according to the second exemplary embodiment of the present invention, because the current mobility is high in the circumferential edge of the contact holes 280, the whole current mobility increases thereby decreasing the voltage (IR) drop, which prevents a decrease in the brightness of the display.

Figure 5:
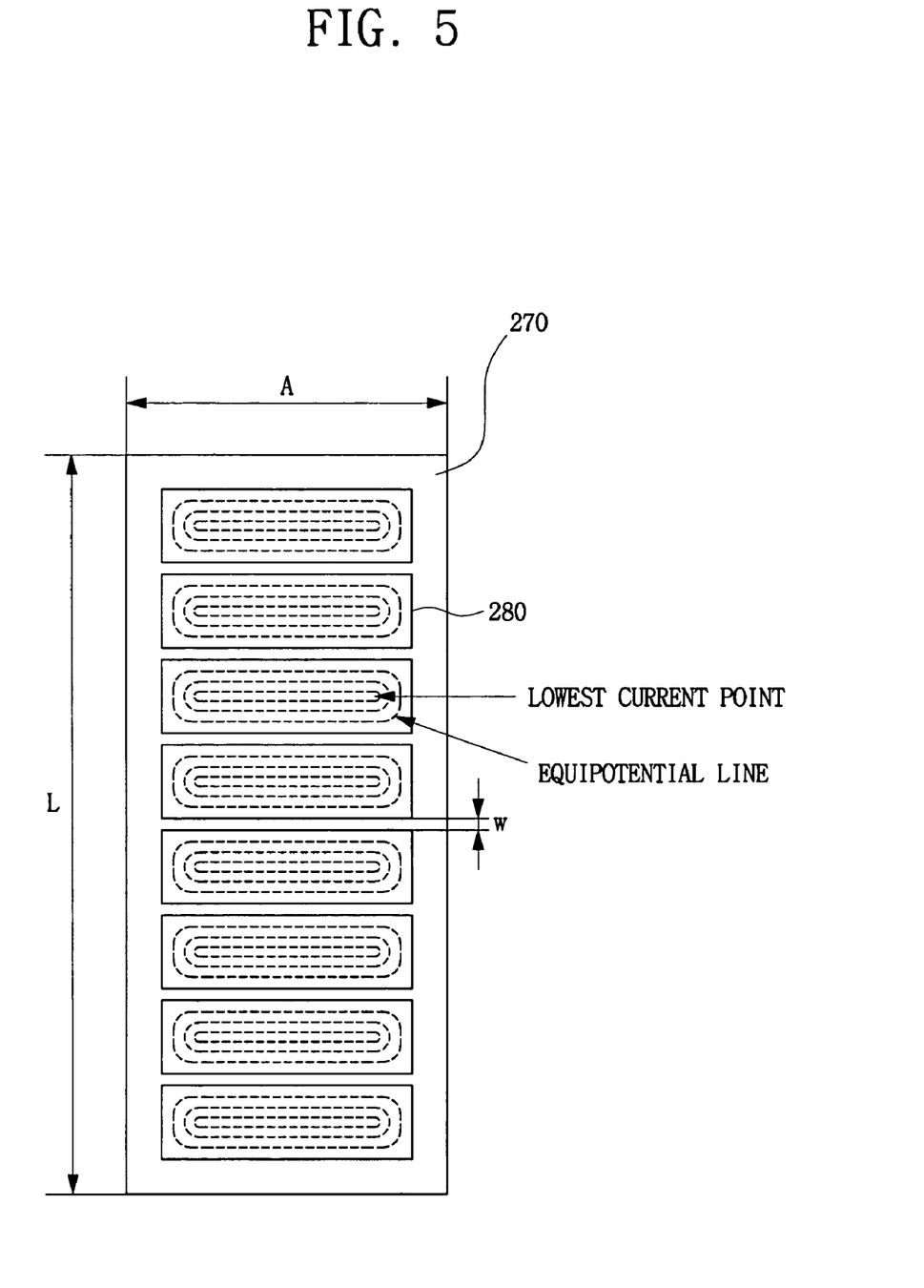
FIG. 5 shows a plan view of a cathode power line connected with a cathode electrode by a plurality of contact holes in an organic electro luminescence display according to a third exemplary embodiment of the present invention.

FIG. 5 shows a plan view of a cathode power line connected with a cathode electrode by a plurality of contact holes in an organic electro luminescence display according to a third exemplary embodiment of the present invention. Since the third exemplary embodiment of the present invention is the same as the organic electro luminescence display illustrated in FIG. 1 except for the structure of the cathode power line and the contact holes, only the cathode power line and the contact holes are illustrated in FIG. 5.

Referring to FIG. 5, the cathode power line 270 is electrically coupled to the cathode electrode by a plurality of contact holes 280, which are formed in an interposed insulating layer (not shown).

The contact holes 280 are arranged as a single column in the region where the cathode power line 270 is overlapped with the cathode electrode. Additionally, all contact holes 280 are congruent, and they are arranged to have the same distance between each adjacent contact hole 280. According to the third exemplary embodiment of the present invention as shown in FIG. 5, the contact hole 280 has a rectangular shape, but the contact hole 280 may have any other shape including circular, square, elliptical, and polygonal.

According to this third exemplary embodiment, the contact holes 280 are formed so that the foregoing conditions (1) and (2) are satisfied. When the foregoing conditions (1) and (2) are satisfied, the total circumference of the plurality of contact holes is greater than the circumference of the region of the cathode power line that is overlapped with the cathode electrode, thereby increasing the current mobility and preventing the voltage (IR) drop. In this third exemplary embodiment, the distance "w" between the adjacent contact holes arranged in a single column should be equal to or less than the lengths of each contact hole in the column direction.

The exemplary embodiments shown in FIGS. 3, 4, and 5 show the contact holes in the insulating layer between the cathode power line and cathode electrode to be of the same size and shape, but they may be formed in different sizes and shapes. In other words, rectangular contact holes and circular contact holes may be formed together in the insulating layer. As with the exemplary embodiments shown in FIGS. 3, 4, and 5, however, the total circumference of the different sized and shaped contact holes must be greater than the circumference of the region where the cathode power line is overlapped the cathode electrode.

Figure 6:
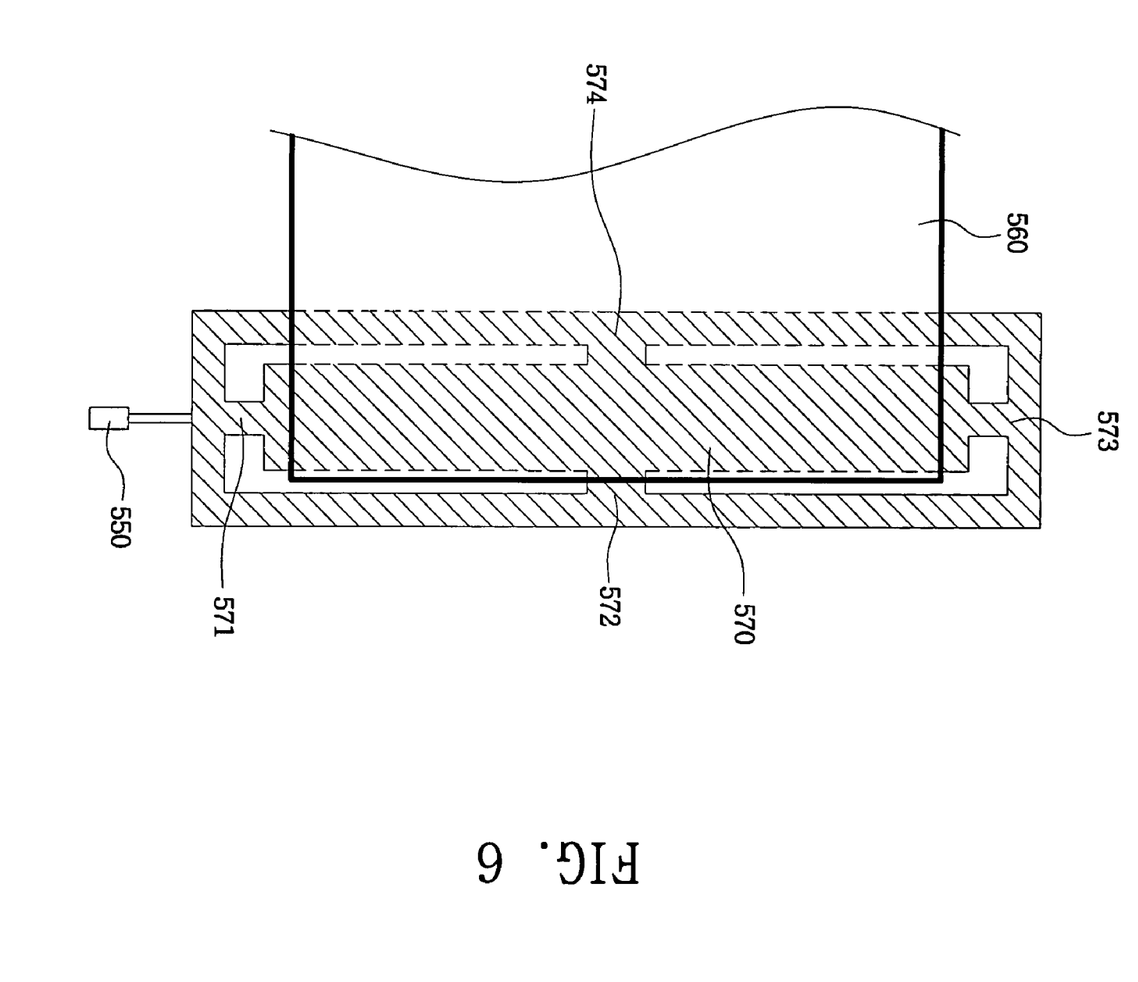
FIG. 6 shows a plan view of a cathode power line in an organic electro luminescence display according to a fourth exemplary embodiment of the present invention.

FIG. 6 shows a plan view of an organic electro luminescence display according to a fourth exemplary embodiment of the present invention. Since the fourth exemplary embodiment of the present invention is the same as the organic electro luminescence display illustrated in FIG. 1 except for the structure of the cathode power line and the contact holes, only a connection portion of the cathode power line is illustrated in FIG. 6. Contact holes are not illustrated in FIG. 6.

Referring to FIG. 6, the organic electro luminescence display according to a fourth embodiment of the present invention comprises a cathode power line 570 overlapped with, and supplying a cathode voltage to, a cathode electrode 560, and cathode auxiliary power lines 571, 572, 573, and 574 to supply the voltage applied at the external terminal 550 to the cathode power line 570.

When cathode voltage is applied at the external terminal 550, the cathode voltage is supplied to four sides of the cathode power line 570 through the cathode auxiliary power lines 571, 572, 573, and 574. The cathode voltage is, in turn, supplied from the cathode power line 570 to the cathode electrode 560 via a plurality of contact holes as exemplified in the first, second, and third exemplary embodiments.

In the organic electro luminescence display according to the fourth exemplary embodiment shown in FIG. 6, the cathode voltage is supplied from the external terminal 550 to four sides of the cathode power line 570 through the cathode auxiliary power lines 571, 572, 573, and 574. On the other hand, in the first through third exemplary embodiments, the cathode voltage is supplied from the external terminal to one side of the cathode power line. As a result of utilizing cathode auxiliary power lines 571, 572, 573, and 574, the voltage (IR) drop in the cathode power line decreases, which enhances the brightness of the display.

In the fourth exemplary embodiment, the cathode voltage is supplied from one external terminal 550 to four sides of the cathode power line 570 through the cathode auxiliary power lines 571, 572, 573, and 574, but it may also be supplied from a plurality of external terminals 550 to four sides of the cathode power line 570 through the cathode auxiliary power lines 571, 572, 573, and 574, respectively. Further, the cathode voltage may be supplied through the respective cathode auxiliary power lines to two or three sides, as well as four sides of the cathode power line. Moreover, a plurality of cathode auxiliary lines may also be arranged on one, two, or three sides of the cathode power line, and thus the cathode voltage can be supplied from one or more external terminals to one or more positions on one or more sides of the cathode power line. In the organic electro luminescence display of the fourth exemplary embodiment, the cathode power line 570 may include a plurality of contact holes having the same structure as the contact holes as exemplified in the first, second, and third exemplary embodiments.

In the illustrated exemplary embodiments, the cathode power line is provided at one side of the pixel portion, and it is connected with the cathode electrode via contact holes. However, at least one cathode power line may be provided on the top, bottom, left and right sides of the pixel portion. Further, in the illustrated exemplary embodiments, the contact holes for connecting the cathode power line with the cathode electrode were rectangular, including a square, and circular. But the contact holes may have any other shape including elliptical and polygonal.

As described above in the exemplary embodiments, the organic electro luminescence display according to the present invention compensates for the voltage (IR) drop by utilizing a cathode power line connected to a cathode electrode via a plurality of contact holes and by supplying a cathode voltage from the external terminal to the cathode power line via cathode auxiliary power lines.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic electro luminescence display, comprising:
a pixel portion on which a plurality of pixels are arranged with a first electrode, a second electrode, and an organic thin film layer interposed between the first and second electrodes;
a first power line supplying a first level voltage to the pixels of the pixel portion;
a second power line having at least a region overlapped with the second electrode to supply a second level voltage to the second electrode; and
an insulating layer having a plurality of contact holes in the region where the second power line is overlapped with the second electrode,
wherein the sum of circumferences of each of the plurality of contact holes is greater than the circumference of the region where the second power line is overlapped with the second electrode.

2. The organic electro luminescence display of claim 1, wherein a plurality of equipotential lines exist on the region in which the second power line is overlapped with the second electrode.

3. The organic electro luminescence display of claim 1, wherein a plurality of lowest current points having an equivalent level exist on the region in which the second power line is overlapped the second electrode.

4. The organic electro luminescence display of claim 1, wherein all contact holes are rectangular or square.

5. The organic electro luminescence display of claim 4, wherein the distances between the adjacent contact holes in the row and column directions is equal to or less than at least one of lengths of each contact hole in the row and column directions.

6. The organic electro luminescence display of claim 4, wherein the distances between the adjacent contact holes in the row and column directions is equal to or less than the least of the lengths of each contact hole in the row and column direction.

7. The organic electro luminescence display of claim 1, wherein all contact holes are circular or elliptical.

8. The organic electro luminescence display of claim 7, wherein, when the contact hole has the circular shape, the distance between adjacent contact holes is equal to or less than the diameter of the contact hole.

9. The organic electro luminescence display of claim 1, wherein the second level voltage is supplied to at least one position on at least one side of the second power line.

10. The organic electro luminescence display of claim 1, wherein the plurality of contact holes are congruent, and adjacent contact holes are equally spaced from each other.

11. An organic electro luminescence display, comprising:
a pixel portion on which a plurality of pixels are arranged with a first electrode, a second electrode, and an organic thin film layer interposed between the first electrode and the second electrode;
a first power line supplying a first level voltage to the pixels of the pixel portion;
a second power line having at least a region overlapped with the second electrode to supply a second level voltage to the second electrode,
an insulating layer having a plurality of contact holes in the region where the second power line is overlapped with the second electrode,
wherein the second power line is arranged on at least one side of the pixel portion, and
wherein the second power line includes a plurality of auxiliary power lines to supply the second level voltage to the second power line.

12. The organic electro luminescence display as claimed in claim 11, wherein a plurality of equipotential lines exist on the region in which the second power line is overlapped with the second electrode.

13. The organic electro luminescence display of claim 11, wherein a plurality of lowest current points having an equivalent level exist on the region in which the second power line is overlapped with the second electrode.

14. The organic electro luminescence display of claim 11, wherein all contact holes are rectangular or square.

15. The organic electro luminescence display of claim 14, wherein the distance between the adjacent contact holes in the row and column directions is equal to or less than at least one of lengths of each of the plurality of contact holes in the row and column directions.

16. The organic electro luminescence display as claimed in claim 14, wherein the distances between the adjacent contact holes in the row and column directions is equal to or less than the least of the lengths of each contact hole in the row and column direction.

17. The organic electro luminescence display of claim 11, wherein all contact holes are circular or elliptical.

18. The organic electro luminescence display of claim 17, wherein, when the contact hole is circular, a distance between adjacent contact holes is equal to or less than a diameter of the contact hole.

19. The organic electro luminescence display of claim 11, wherein the auxiliary power lines are arranged to supply the second level voltage from at least two sides of the second power line to the second electrode.

20. The organic electro luminescence display of claim 19, wherein the auxiliary power lines are arranged to supply the second level voltage from at least one position of each side of the second power line to the second electrode.

21. The organic electro luminescence display of claim 11, wherein the plurality of contact holes are congruent, and adjacent contact holes are equally spaced from each other.

22. The organic electro luminescence display of claim 21, wherein the plurality of contact holes are congruent, and adjacent contact holes are equally spaced from each other.

23. The organic electro luminescence display of claim 11, wherein the sum of the circumferences of each of the plurality of contact holes is greater than the circumference of the region in which the second power line and the second electrode overlap each other.

24. An organic electro luminescence display, comprising:
a pixel portion on which a plurality of pixels are arranged with a first electrode, a second electrode, and an organic thin film layer interposed between the first electrode and the second electrode;
a first power line supplying a first level voltage to the pixels of the pixel portion;
a second power line having at least a region overlapped with the second electrode to supply a second level voltage to the second electrode, the region being arranged outside the pixel portion; and
an insulating layer having a plurality of contact holes in the region where the second power line is overlapped with the second electrode,
wherein the plurality of contact holes, arranged in a matrix of rows and columns, and coupling the second electrode to the second power line, and
wherein the insulating layer includes at least two contact holes in the column direction.

25. The organic electro luminescence display of claim 24, wherein all contact holes are rectangular or square.

26. The organic electro luminescence display of claim 25, wherein the distance between the adjacent contact holes is equal to or less than at least one of lengths of each contact hole in the row direction and the column direction.

27. The organic electro luminescence display of claim 25, wherein the distances between the adjacent contact holes in the row and column directions is equal to or less than the least of the lengths of each contact hole in the row direction and the column direction.

28. The organic electro luminescence display of claim 24, wherein all contact holes are circular or elliptical.

29. The organic electro luminescence display of claim 28, wherein, when the contact hole is circular, the distance between adjacent contact holes is equal to or less than a diameter of the contact hole.

30. The organic electro luminescence display of claim 24, wherein the second level voltage is supplied to at least one position on at least one side of the second power line.

31. The organic electro luminescence display of claim 24, wherein sum of circumferences of each of the plurality of contact holes is greater than circumference of region where the second power line and the second electrode overlap each other.

32. The organic electro luminescence display as claimed in claim 24, wherein a plurality of equipotential lines exist on the region in which the second power line is overlapped with the second electrode.

33. The organic electro luminescence display as claimed in claim 24, wherein a plurality of lowest current points having an equivalent level exist on the region in which the second power line is overlapped with the second electrode.

* * * * *